US011949247B2

(12) United States Patent
Tetsuka

(10) Patent No.: US 11,949,247 B2
(45) Date of Patent: Apr. 2, 2024

(54) POWERED DEVICE AND OPTICAL TRANSMISSION SYSTEM

(71) Applicant: KYOCERA CORPORATION, Kyoto (JP)

(72) Inventor: Nobuyuki Tetsuka, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 214 days.

(21) Appl. No.: 17/626,493

(22) PCT Filed: Jul. 21, 2020

(86) PCT No.: PCT/JP2020/028258
§ 371 (c)(1),
(2) Date: Jan. 12, 2022

(87) PCT Pub. No.: WO2021/024795
PCT Pub. Date: Feb. 11, 2021

(65) Prior Publication Data
US 2022/0285996 A1  Sep. 8, 2022

(30) Foreign Application Priority Data

Aug. 5, 2019  (JP) ................... 2019-143467

(51) Int. Cl.
*H02J 50/30* (2016.01)
*G02B 6/42* (2006.01)
*H04B 10/25* (2013.01)
*H04B 10/67* (2013.01)

(52) U.S. Cl.
CPC ............ *H02J 50/30* (2016.02); *G02B 6/4214* (2013.01); *H04B 10/25* (2013.01); *H04B 10/67* (2013.01)

(58) Field of Classification Search
CPC .............................. H02J 50/30; H04B 10/807
See application file for complete search history.

(56) References Cited

U.S. PATENT DOCUMENTS

| 2010/0012819 A1* | 1/2010 | Graham ............... H02J 50/30 250/237 R |
| 2011/0005581 A1* | 1/2011 | Kanbara ............... H02S 20/24 136/251 |
| 2014/0054961 A1* | 2/2014 | Metcalf ............... H02J 7/00034 307/19 |
| 2014/0318620 A1* | 10/2014 | Kare ................... H01L 31/0547 136/259 |
| 2019/0020304 A1* | 1/2019 | Bashford ........... G02B 19/0023 |

FOREIGN PATENT DOCUMENTS

| JP | S62242374 A | 10/1987 |
| JP | 2010135989 A | 6/2010 |
| JP | 2012518356 A | 8/2012 |

OTHER PUBLICATIONS

D. Kamiyama, A. Yoneyama and M. Matsuura, "Multichannel Data Signals and Power Transmission by Power-Over-Fiber Using a Double-Clad Fiber," in IEEE Photonics Technology Letters, vol. 30, No. 7, pp. 646-649, 1 Apr. 1, 2018, doi: 10.1109/LPT.2018. 2810158. (Year: 2018).*

* cited by examiner

*Primary Examiner* — Nathan M Cors
(74) *Attorney, Agent, or Firm* — HAUPTMAN HAM, LLP

(57) ABSTRACT

A powered device includes a plurality of photoelectric conversion elements. The photoelectric conversion elements receive feed light. The photoelectric conversion elements are disposed such that light-receiving surfaces of the photoelectric conversion elements are arranged in a concave shape.

5 Claims, 7 Drawing Sheets

POWERED DEVICE AND OPTICAL TRANSMISSION SYSTEM

RELATED APPLICATIONS

The present application is a National Phase of International Application No. PCT/JP2020/028258 filed Jul. 21, 2020, which claims priority to Japanese Application No. 2019-143467, filed Aug. 5, 2019.

TECHNICAL FIELD

The present disclosure relates to a powered device and an optical transmission system.

BACKGROUND ART

In Patent Literature 1, there is disclosed a photoelectric conversion device for monitoring the output of a semiconductor laser. The photoelectric conversion device of Patent Literature 1 has a concave spherical light-receiving surface.

CITATION LIST

Patent Literature

Patent Literature 1: JP S62-242374 A

SUMMARY OF INVENTION

Problem to Solve

Optical power supply can be performed by transmitting high-intensity light through an optical fiber and converting the transmitted light into electric power with a photoelectric conversion element(s). If excessive light is input to the photoelectric conversion element, output current is saturated, and loss is increased. The loss causes the photoelectric conversion element to heat up. When the amount of light received differs from position to position of the photoelectric conversion element, and excessive light is input to a part of the light-receiving surface, the part heats up, and hence the overall amount of light received cannot be increased. In this case, the amount of light received at the other part is small, and use efficiency of the photoelectric conversion element as a whole is low.

Solution to Problem

A powered device of the present disclosure includes a plurality of photoelectric conversion elements that receive feed light,
wherein the photoelectric conversion elements are disposed such that light-receiving surfaces of the photoelectric conversion elements are arranged in a concave shape.

An optical transmission system of the present disclosure includes the above powered device, wherein the optical transmission system transmits the feed light through an optical fiber, and wherein the powered device receives the feed light.

DESCRIPTION OF EMBODIMENTS

Hereinafter, embodiments of the present disclosure will be described in detail with reference to the drawings.

First Embodiment

Figure 1:
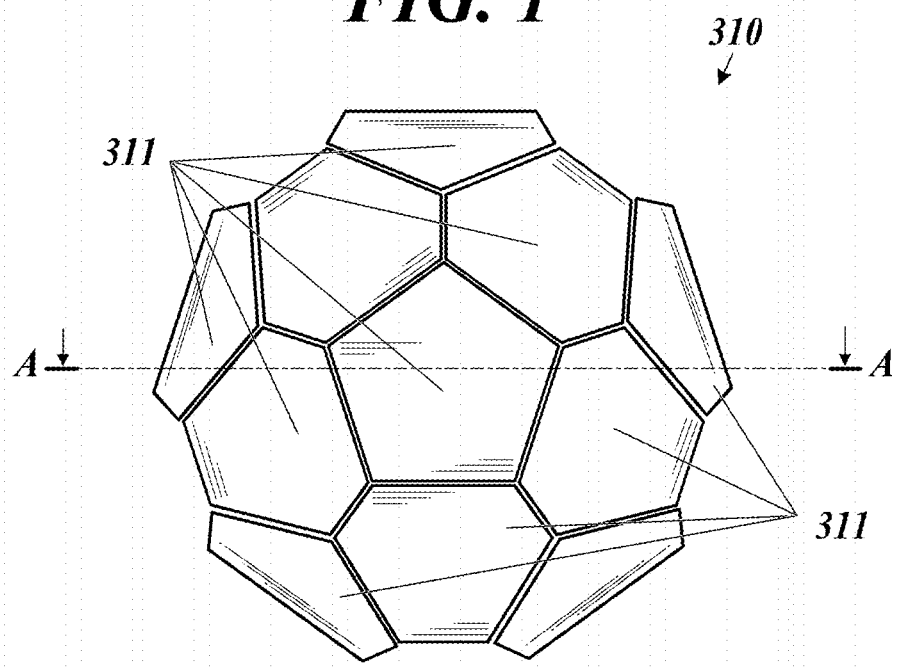
FIG. 1 is a plane view of a powered device according to a first embodiment of the present disclosure.
Figure 2:
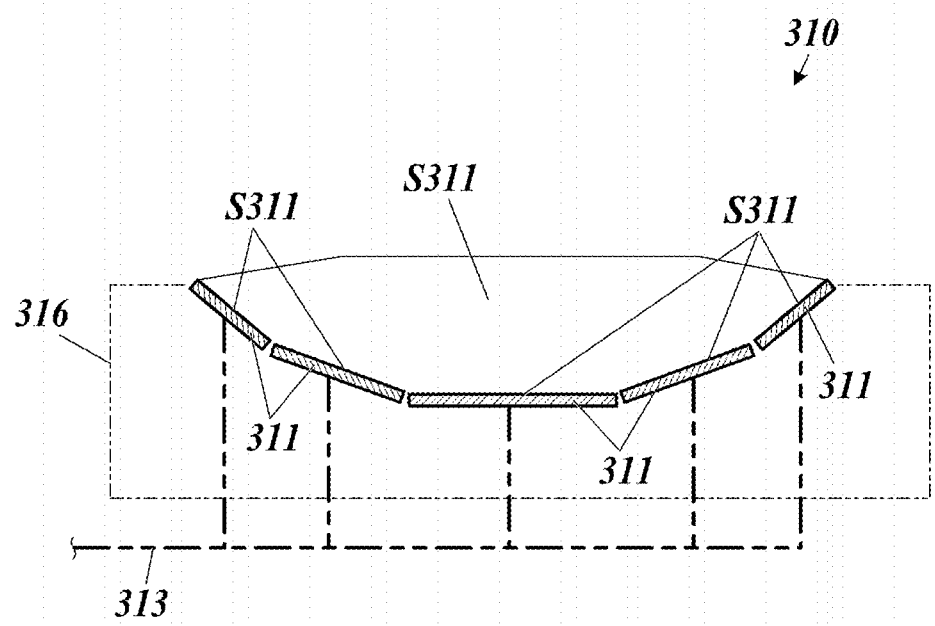
FIG. 2 is a cross-sectional view at line A-A shown in FIG. 1.
Figure 3A:
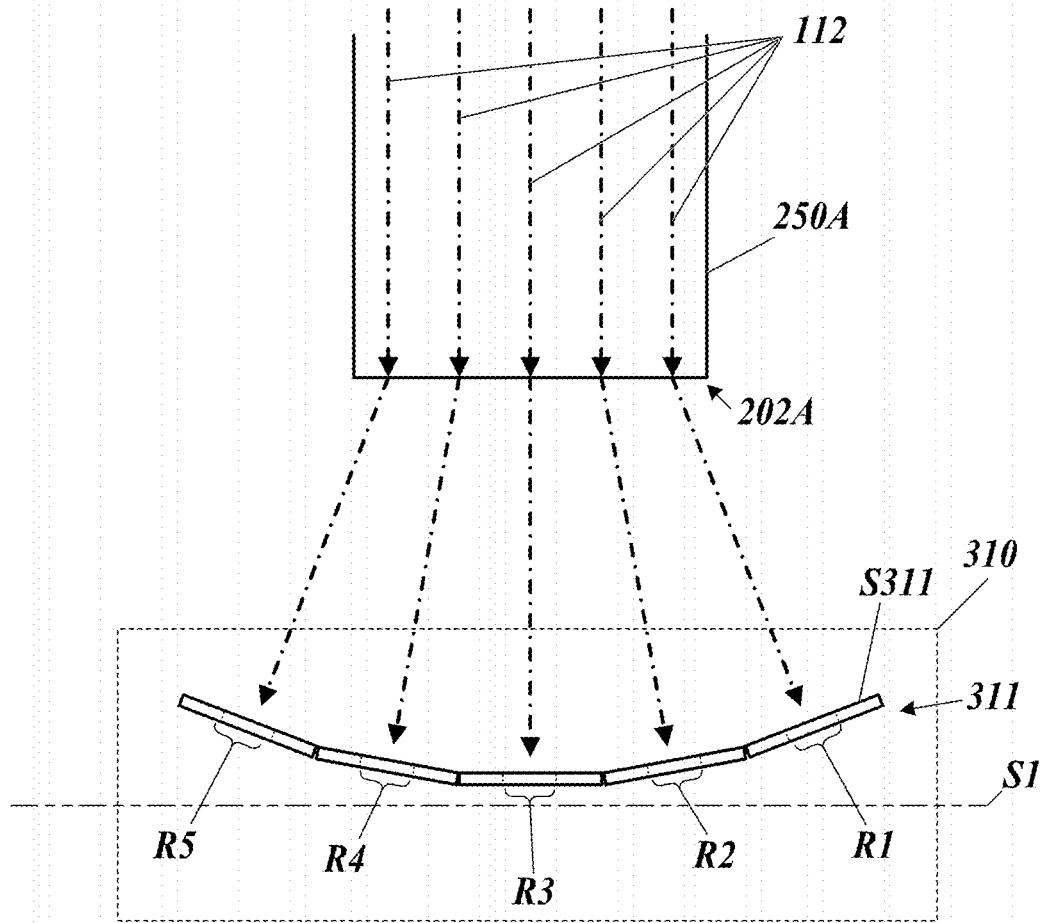
FIG. 3A shows an example in which the powered device according to the first embodiment receives feed light.
Figure 3B:
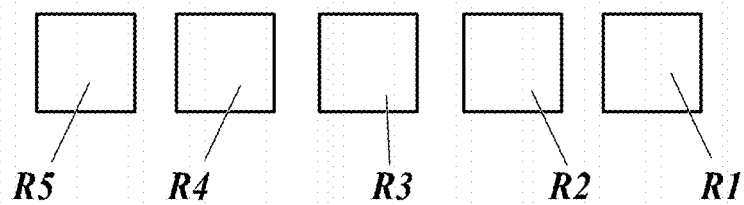
FIG. 3B is an illustration showing the light-receiving areas of photoelectric conversion elements as viewed in the optical axis direction of the feed light in the powered device according to the first embodiment.

FIG. 1 is a plane view of a powered device according to a first embodiment of the present disclosure. FIG. 2 is a cross-sectional view at line A-A shown in FIG. 1. FIG. 3A shows an example in which the powered device according to the first embodiment receives feed light. FIG. 3B is an illustration showing the light-receiving areas of photoelectric conversion elements as viewed in the optical axis direction of the feed light in the powered device according to the first embodiment.

A powered device (PD) 310 of the first embodiment receives feed light 112 and outputs electric power, and includes a plurality of photoelectric conversion elements 311 and a holder 316 that holds the photoelectric conversion elements 311 in a predetermined arrangement. The photoelectric conversion elements 311 are each made of a semiconductor material, which is described below, have a light-receiving surface S311 (shown in FIG. 2) on one side, convert light input to the light-receiving surface S311 into electric power, and output the electric power through a power line 313 (shown in FIG. 2). The light receiving surfaces S311 may each be planar or curved.

As shown in FIG. 2, the holder 316 holds the photoelectric conversion elements 311 such that the light-receiving surfaces S311 are arranged in a concave shape. The concave shape may be a tubular concave shape in which a vertical section along a first axis is gently concave and a vertical section along a second axis is planar or a concave shape in which vertical sections in both directions are gently concave, wherein the first axis and the second axis at right angles to one another are selected as appropriate. The example shown in FIG. 1 and FIG. 2 employs the latter concave shape.

FIG. 3A shows a part extracted from the photoelectric conversion elements 311 that are arranged in a concave shape. Suppose that a reference plane S1 is present opposite the light-receiving surfaces S311. The reference plane S1 is perpendicular to the central optical axis of the feed light 112.

The photoelectric conversion elements 311 are arranged such that as they are arranged closer to the center, their distances to the reference plane S1 are shorter; in other words, as they are arranged closer to the edges, their distances to the reference plane S1 are longer. Further, as the photoelectric conversion elements 311 are arranged closer to the center, the inclination angles of their light-receiving surfaces S311 to the reference plane S1 are smaller; in other words, as the photoelectric conversion elements 311 are arranged closer to the edges, the inclination angles of their light-receiving surfaces S311 to the reference plane S1 are larger. The light-receiving surfaces S311 are inclined such that the perpendicular lines of the light-receiving surfaces S311 approach the perpendicular line of the central light-receiving surface S311 as they are extended toward the supplying side from which the feed light 112 is supplied. The perpendicular lines of the light-receiving surfaces S311 of the photoelectric conversion elements 311 may intersect the output end for the feed light 112 (other end 202A of an optical fiber 250A).

As shown in FIG. 1, the light-receiving surfaces of the photoelectric conversion elements 311 each have a shape having straight sides and corners. The corners are not limited to being sharp and may be a little rounded. At least one of the photoelectric conversion elements 311 has a shape of a polygon, such as a pentagon or hexagon, with straight sides and corners. All the sides of the polygonal photoelectric conversion element 311 may be adjacent to straight sides of other photoelectric conversion elements 311. In the example shown in FIG. 1, all the photoelectric conversion elements 311 have hexagonal or pentagonal light-receiving surfaces, and when attention is paid to a pair of adjacent photoelectric conversion elements 311, one side and two corners of one photoelectric conversion element 311 are adjacent to those of the other photoelectric conversion element 311 with a small gap therebetween. Further, when attention is paid to a photoelectric conversion element 311 at the center and photoelectric conversion elements 311 therearound, all the sides and corners of the central photoelectric conversion element 311 are adjacent to straight sides and corners of photoelectric conversion elements 311 adjacent to the central photoelectric conversion element 311 with small gaps therebetween. The adjacent sides may be in contact with one another. The adjacent corners may be in contact with one another.

Next, actions of the powered device 310 will be described. As shown in FIG. 3A, the feed light 112 supplied from outside spreads and is input to the light-receiving surfaces S311 of the photoelectric conversion elements 311. At the time, since the photoelectric conversion elements 311 are arranged in a concave shape, the feed light 112 is input to the light-receiving surfaces S311 of the photoelectric conversion elements 311 by propagating almost equal distances, regardless of the positions of the photoelectric conversion elements 311. Further, the feed light 112 is input to the light-receiving surfaces S311 of the photoelectric conversion elements 311 almost perpendicularly. Suppose that rectangular regions R1 to R5 of a unit area are set on the light-receiving surfaces S311. As shown in FIG. 3B, of the photoelectric conversion elements 311, which are from the one at the center to the ones at the edges, the rectangular regions R1 to R5 as viewed in the optical axis directions of the feed light (feed beams) 112 that travels toward the respective photoelectric conversion elements 311 have almost the same area. Hence, when intensities (densities) of the feed light 112 input to any two photoelectric conversion elements 311 are compared, there is no large difference in the intensity of the feed light 112 per unit area.

Figure 4A:
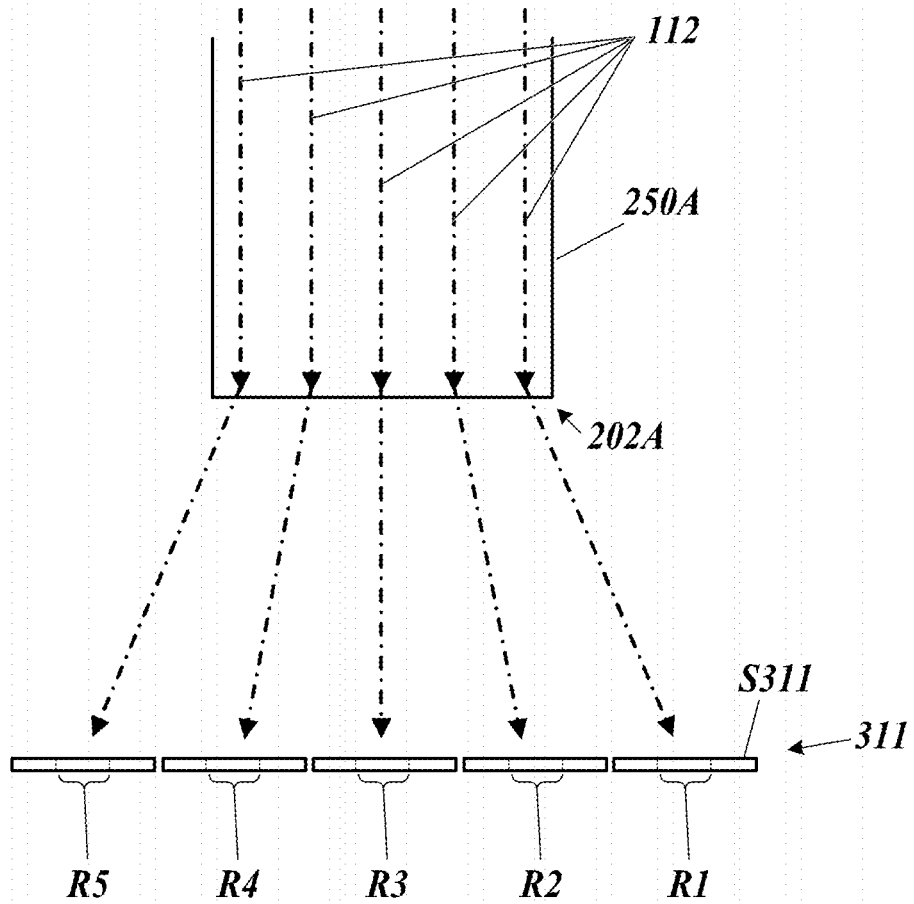
FIG. 4A shows an example in which a powered device of a comparative example receives the feed light.
Figure 4B:
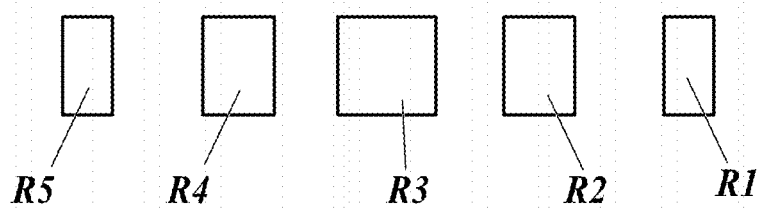
FIG. 4B is an illustration showing the light-receiving areas of the photoelectric conversion elements as viewed in the optical axis direction of the feed light in the powered device of the comparative example.

FIG. 4A shows an example in which a powered device of a comparative example receives the feed light. FIG. 4B is an illustration showing the light-receiving areas of the photoelectric conversion elements as viewed in the optical axis direction of the feed light in the powered device of the comparative example. The comparative example shown in FIG. 4A is an example in which the photoelectric conversion elements 311 are arranged in a planar shape. In the comparative example shown in FIG. 4A, as shown in FIG. 4B, the rectangular regions R1 to R5 as viewed in the optical axis directions of the feed light (feed beams) 112 that is input to the respective photoelectric conversion elements 311 do not have the same area. Hence, when intensities of the feed light 112 input to a photoelectric conversion element 311 near the center and a photoelectric conversion element 311 near an edge are compared, the one near the center has a higher intensity of the feed light 112 per unit area than the one near the edge.

Hence, in the arrangement of the comparative example shown in FIG. 4A and FIG. 4B, even when high-intensity feed light 112 is transmitted, and the output of the central photoelectric conversion element 311 approaches saturation, the amount of light received by the photoelectric conversion elements 311 near the edges does not increase and have some photoelectric conversion capacity left. That is, use efficiency of the photoelectric conversion elements 311 is low. On the other hand, as shown in FIG. 3A and FIG. 3B, in the powered device 310 of the first embodiment, when high-intensity feed light 112 is transmitted, and the output of the central photoelectric conversion element 311 approaches saturation, the output of the photoelectric conversion elements 311 near the edges also approaches saturation. Thus, the powered device 310 of the first embodiment can obtain a higher use efficiency of the photoelectric conversion elements 311 as compared with that having the arrangement of the comparative example.

Second Embodiment

Figure 5:
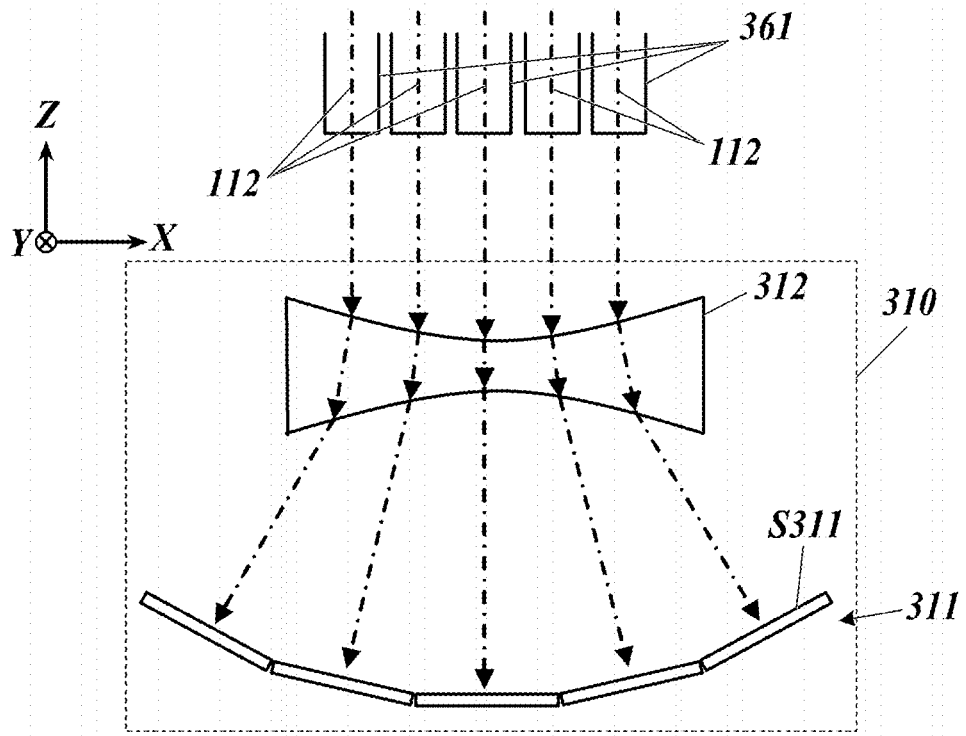
FIG. 5 shows a powered device according to a second embodiment of the present disclosure.

FIG. 5 shows a powered device according to a second embodiment of the present disclosure. A powered device 310 of the second embodiment includes a plurality of photoelectric conversion elements 311 and a diffusing lens 312 that spreads the feed light 112. The diffusing lens 312 may be any lens as far as it acts to spread parallel light, such as a plano-concave lens or a biconcave lens. The diffusing lens 312 may be a lens that spreads light in a direction of one axis, such as a cylindrical lens, or a lens that spreads light in directions of two axes, such as a spherical lens.

FIG. 5 shows an example in which the powered device 310 receives the feed light 112 output from a plurality of optical fibers 361. The optical fibers 361 may be bundled so as to be equally arranged in a cylindrical frame or may be bundled so as to be arranged in an oblong frame, which is long sideways. In FIG. 5, X, Y and Z directions that are at right angles to one another are shown. If the optical fibers 361 are bundled so as to be arranged in a frame that is short in the Y direction and long in the X direction, a cylindrical lens having the X-Z section and the Y-Z section that are concave and straight, respectively, may be used as the diffusing lens 312. The powered device 310 of the second embodiment may be configured, as shown in FIG. 3, to receive the feed light 112 output from one optical fiber 250A.

The photoelectric conversion elements 311 of the second embodiment are arranged such that the perpendicular lines of the light-receiving surfaces S311 pass through the diffusing lens 312. Other elements of the arrangement form of the photoelectric conversion elements 311 are the same as those in the first embodiment.

In the configuration shown in FIG. 5, the feed light 112 supplied from outside is spread by the diffusing lens 312 and input to the light-receiving surfaces S311 of the photoelectric conversion elements 311. At the time, since the photoelectric conversion elements 311 are arranged in a concave shape, the feed light 112 is input to the light-receiving surfaces S311 of the photoelectric conversion elements 311 by propagating almost equal distances, regardless of the positions of the photoelectric conversion elements 311. Further, the feed light 112 is input to the light-receiving surfaces S311 almost perpendicularly. Hence, when intensities (densities) of the feed light 112 input to any two photoelectric conversion elements 311 are compared, there is no large difference in the intensity of the feed light 112 per unit area, and a high use efficiency of the photoelectric conversion elements 311 can be obtained.

First Embodiment of Power Over Fiber System

Figure 6:
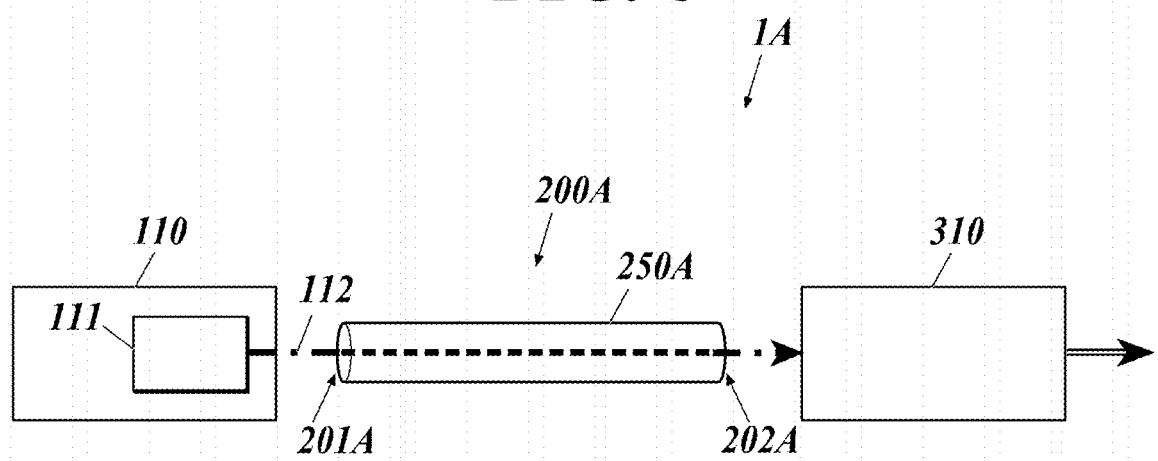
FIG. 6 shows a first embodiment of a power over fiber system.

FIG. 6 shows a first embodiment of a power over fiber system. A power over fiber (PoF) system 1A of the first embodiment is an optical transmission system that transmits the feed light 112 through an optical fiber 250A. The power over fiber system 1A includes a power sourcing equipment (PSE) 110, an optical fiber cable 200A and a powered device 310. In the present disclosure, a power sourcing equipment converts electric power into optical energy and supplies (sources) the optical energy, and a powered device receives (draws) the supplied optical energy and converts the optical energy into electric power.

The power sourcing equipment 110 includes a semiconductor laser 111 for power supply. The power sourcing equipment 110 is connected to a power source, and electrically drives the semiconductor laser 111 and so forth. The semiconductor laser 111 oscillates with the electric power from the power source, thereby outputting the feed light 112.

The optical fiber cable 200A includes the optical fiber 250A that forms a transmission path of the feed light. The optical fiber cable 200A has one end 201A connectable to the power sourcing equipment 110 and the other end 202A connectable to the powered device 310 to transmit the feed light 112. The feed light 112 from the power sourcing equipment 110 is input to the one end 201A of the optical fiber cable 200A, propagates through the optical fiber 250A, and is output from the other end 202A of the optical fiber cable 200A to the powered device 310.

The powered device 310 has the configuration of the first embodiment or the second embodiment shown in FIG. 1 to FIG. 3 or in FIG. 5. The powered device 310 may be arranged such that the input port for the feed light 112 faces the other end 202A (output end) of the optical fiber 250A. The input port corresponds to a part that the light-receiving surfaces S311 of the photoelectric conversion elements 311 face in the configuration shown in FIG. 1 to FIG. 3, and corresponds to a part that the input surface of the diffusing lens 312 faces in the configuration shown in FIG. 5. The photoelectric conversion elements 311 convert the feed light 112 transmitted through the optical fiber cable 200A into electric power. The electric power obtained by the conversion by the photoelectric conversion elements 311 is driving power needed in the powered device 310. The powered device 310 may be configured to be capable of outputting, for an external device(s), the electric power obtained by the conversion by the photoelectric conversion elements 311.

Semiconductor materials of semiconductor regions of the semiconductor laser 111 and the photoelectric conversion elements 311 are semiconductors having a laser wavelength being a short wavelength of 500 nm or less. The semiconductor regions exhibit light-electricity conversion effect. Semiconductors having a laser wavelength being a short wavelength have a large band gap and a high photoelectric conversion efficiency, and hence improve photoelectric conversion efficiency at the power supplying side and the power receiving side in optical power supply, and improve optical power supply efficiency. Hence, as the semiconductor materials, laser media having a laser wavelength (base wave) of 200 nm to 500 nm may be used. Examples thereof include diamond, gallium oxide, aluminum nitride and gallium nitride. Further, as the semiconductor materials, semiconductors having a band gap of 2.4 eV or greater are used. For example, laser media having a band gap of 2.4 eV to 6.2 eV may be used. Examples thereof include diamond, gallium oxide, aluminum nitride and gallium nitride. Laser light having a longer wavelength tends to have a higher transmission efficiency, whereas laser light having a shorter wavelength tends to have a higher photoelectric conversion efficiency. Hence, when laser light is transmitted for a long distance, laser media having a laser wavelength (base wave) of greater than 500 nm may be used as the semiconductor materials, whereas when the photoelectric conversion efficiency is given priority, laser media having a laser wavelength (base wave) of less than 200 nm may be used as the semiconductor materials. Any of these semiconductor materials may be used in one of the semiconductor laser 111 and the photoelectric conversion elements 311. This improves the photoelectric conversion efficiency at either the power supplying side or the power receiving side, and improves the optical power supply efficiency.

Second Embodiment of Power Over Fiber System

Figure 7:
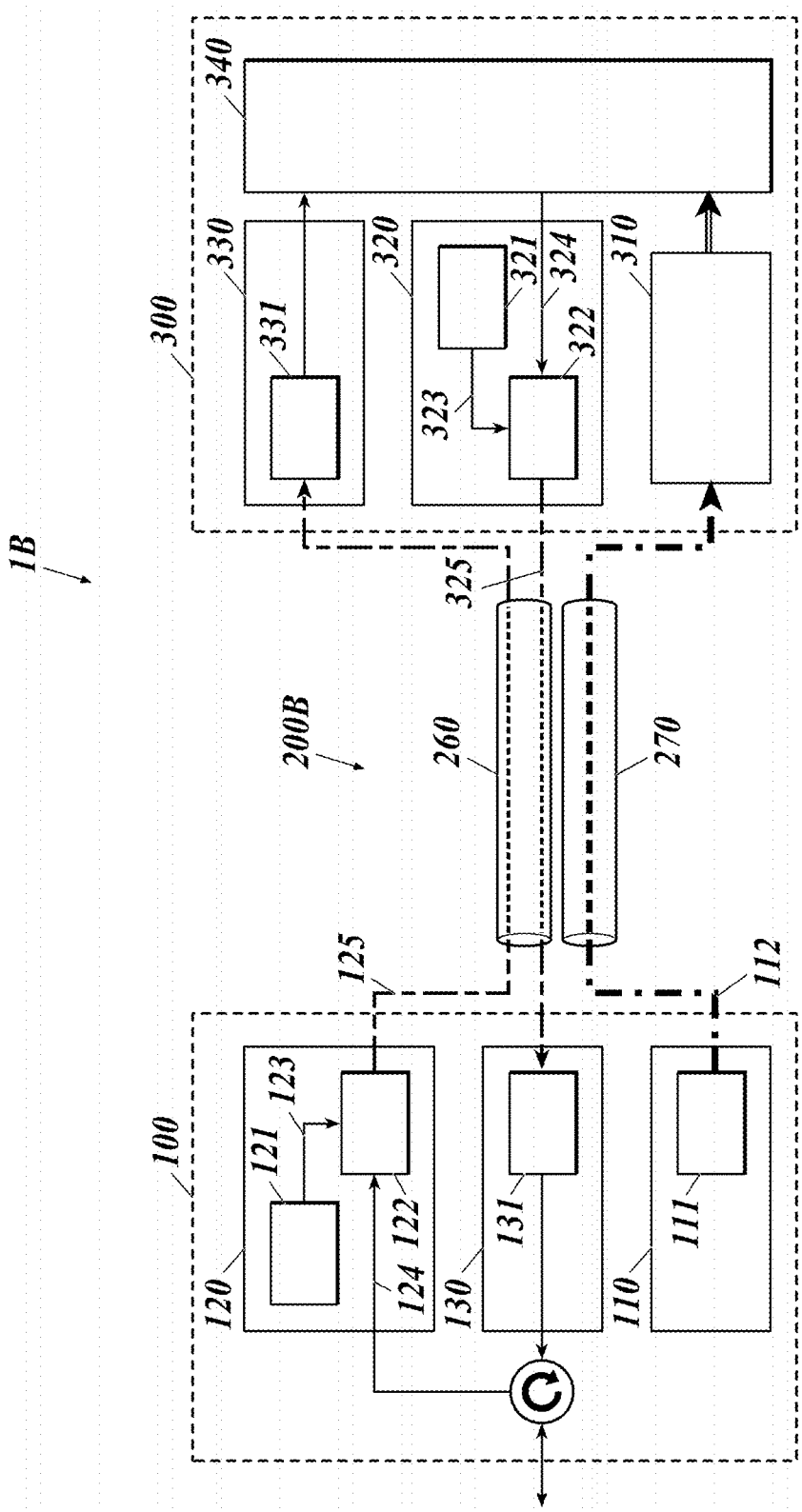
FIG. 7 shows a second embodiment of a power over fiber system.

FIG. 7 shows a second embodiment of a power over fiber system. A power over fiber system 1B of the second embodiment is an optical transmission system that transmits the signal light 125/325 and the feed light 112 through optical fibers 260 and 270, respectively. The signal light 125, 325 may be transmitted bidirectionally through one optical fiber 260. The power over fiber system 1B includes: a first data communication device 100 including a power sourcing equipment 110; an optical fiber cable 200; and a second data communication device 300 including a powered device 310.

The first data communication device 100 corresponds to a data terminal equipment (DTE), a repeater or the like. The first data communication device 100 is a node in a communication network. The first data communication device 100 may be a node that communicates with another node.

The first data communication device 100 includes, in addition to the power sourcing equipment 110, a transmitter 120 and a receiver 130 for data communication. The power sourcing equipment 110 has a configuration similar to that shown in FIG. 6. The transmitter 120 includes a semiconductor laser 121 for signals and a modulator 122. The modulator 122 modulates laser light 123 output by the semiconductor laser 121 to the signal light 125 on the basis of transmission data 124, and outputs the signal light 125. The receiver 130 includes a photodiode 131 for signals. The photodiode 131 demodulates the signal light 325 transmitted through the optical fiber cable 200 to an electric signal, and outputs the electric signal. Data of the electric signal is transmitted to a node, whereas data from the node is the transmission data 124. The first data communication device 100 is connected to a power source, and electrically drives the semiconductor laser 111, the semiconductor laser 121, the modulator 122, the photodiode 131 and so forth.

The optical fiber cable 200 includes the optical fiber 260 that transmits the signal light 125/325 and the optical fiber 270 that transmits the feed light 112. The optical fiber 260 may be a single-mode optical fiber. The optical fiber 270 may be a multimode optical fiber.

The second data communication device 300 corresponds to a power end station or the like. The second data communication device 300 is a node in a communication network. The second data communication device 300 may be a node that communicates with another node.

The second data communication device 300 includes, in addition to the powered device 310, a transmitter 320, a receiver 330 and a data processing unit 340. The powered device 310 has a configuration similar to that shown in FIG. 6. The powered device 310 may be arranged such that the input port for the feed light 112 faces the output end of the optical fiber 270. The transmitter 320 includes a semiconductor laser 321 for signals and a modulator 322. The modulator 322 modulates laser light 323 output by the semiconductor laser 321 to the signal light 325 on the basis of transmission data 324, and outputs the signal light 325. The receiver 330 includes a photodiode 331 for signals. The photodiode 331 demodulates the signal light 125 transmitted through the optical fiber cable 200 to an electric signal, and outputs the electric signal to the data processing unit 340. The data processing unit 340 transmits data of the electric signal to a node, and also receives data from the node and outputs the data to the modulator 322 as the transmission data 324. The data processing unit 340 processes received signals.

The electric power obtained by the conversion by the photoelectric conversion elements 311 of the powered device 310 is driving power needed in the second data communication device 300, for example, driving power for the transmitter 320, the receiver 330 and the data processing unit 340. The second data communication device 300 may be capable of outputting, for an external device(s), the electric power obtained by the conversion by the photoelectric conversion elements 311.

In the power over fiber system 1B thus configured, the signal light 125 and the feed light 112 output from the first data communication device 100 propagate through the optical fibers 260 and 270 of the optical fiber cable 200B, respectively, and are transmitted to the second data communication device 300. The signal light 325 output from the second data communication device 300 propagates through the optical fiber 260 of the optical fiber cable 200B and is transmitted to the first data communication device 100.

Third Embodiment of Power Over Fiber System

Figure 8:
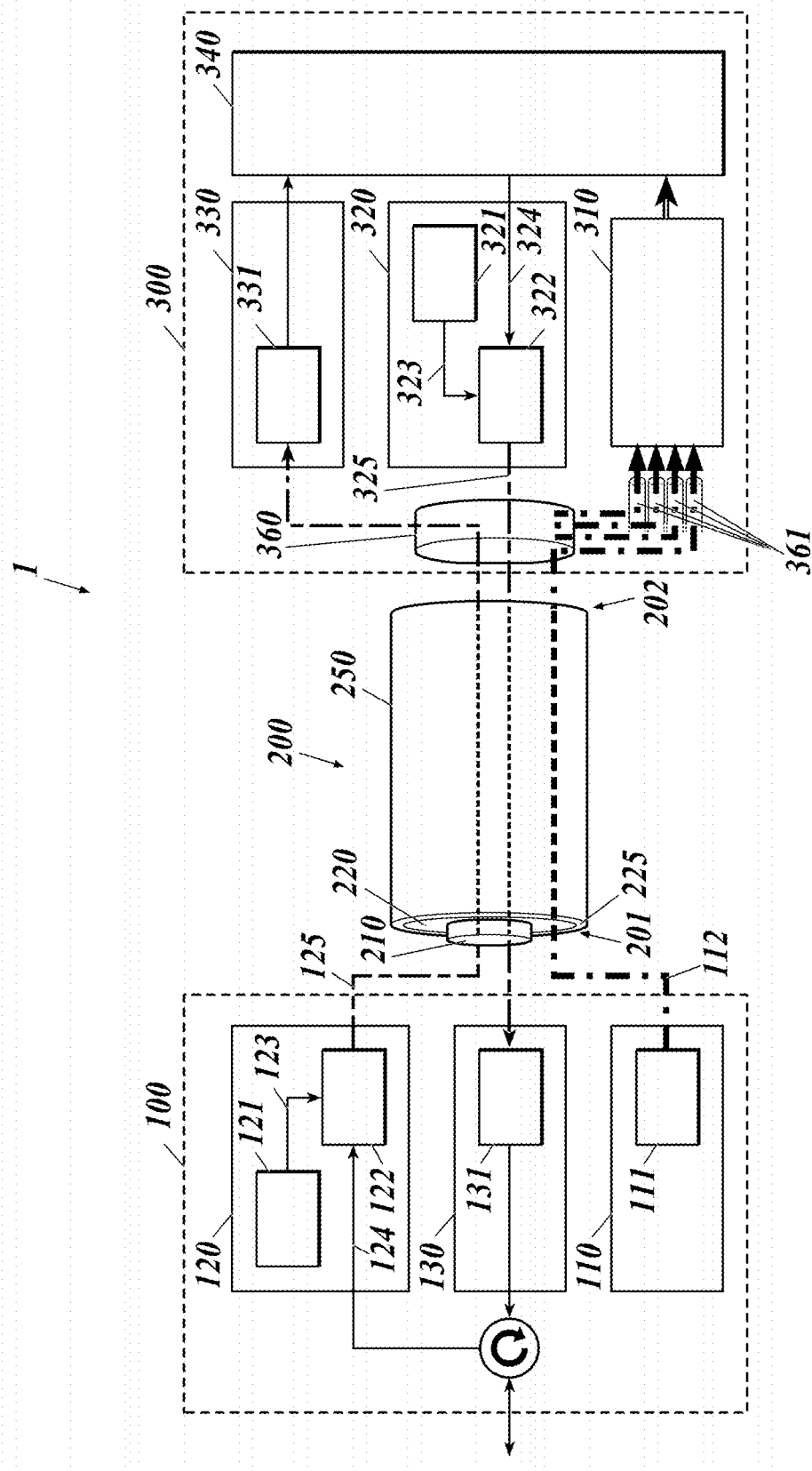
FIG. 8 shows a third embodiment of a power over fiber system.

FIG. 8 shows a third embodiment of a power over fiber system. A power over fiber system 1 of the third embodiment is the same as the power over fiber system 1B of the second embodiment, except for some points. Hereinafter, components or the like that differ from the power over fiber system 1B of the second embodiment will be described in detail.

The power over fiber system 1 includes an optical fiber cable 200 including an optical fiber 250 through which the signal light 125/325 and the feed light 112 propagate. The optical fiber 250 includes: a core 210 that forms a transmission path of the signal light 125/325; a cladding 220 (corresponding to a first cladding) that is arranged around the core 210 and forms a transmission path of the feed light 112; and an outer cladding 225 (corresponding to a second cladding) that is arranged around the cladding 220.

The second data communication device 300 further includes a demultiplexer 360 that demultiplexes (separates) the feed light 112 and the signal light 125 output from the other end 202 of the optical fiber 250. The demultiplexer 360 may be configured to take the feed light 112 output from the cladding 220 into a plurality of optical fibers 361 for demultiplexing (shown in FIG. 5), thereby transmitting the feed light (feed beams) 112 to the powered device 310 through the optical fibers 361. In this case, the powered device 310 may be arranged such that the input port for the feed light 112 faces the output ends of the optical fibers 361.

In the power over fiber system 1 of the third embodiment, the feed light 112 output from the first data communication device 100 propagates through the cladding 220 of the optical fiber 250 and is transmitted to the second data communication device 300. In the second data communication device 300, the input feed light 112 is demultiplexed from the signal light 125 by the demultiplexer 360 and transmitted to the powered device 310.

Fourth Embodiment of Power Over Fiber System

Figure 9:
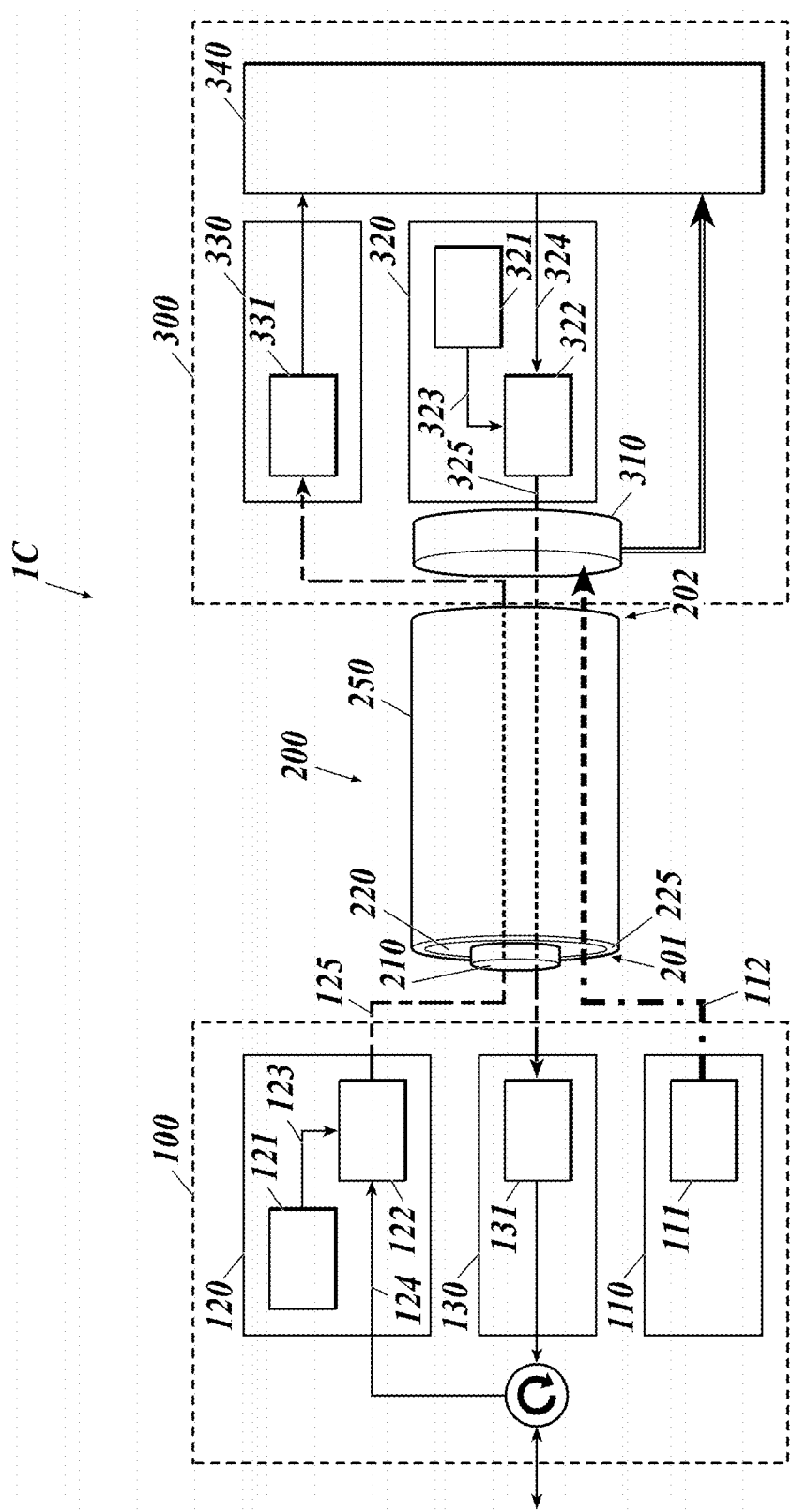
FIG. 9 shows a fourth embodiment of a power over fiber system.

FIG. 9 shows a fourth embodiment of a power over fiber system. A power over fiber system 1C of the fourth embodiment is the same as the power over fiber system 1 of the third embodiment, except for some points. Hereinafter, components or the like that differ from the power over fiber system 1 of the third embodiment will be described in detail.

The powered device 310 of the second data communication device 300 is arranged such that the input port for the feed light 112 faces the other end 202 (output end) of the optical fiber 250. The signal light 125 or 325 that propagates through the core 210 of the optical fiber 250 may be demultiplexed or multiplexed between the other end 202 (output end) of the optical fiber 250 and the photoelectric conversion elements 311 of the powered device 310 and transmitted to the receiver 330 or from the transmitter 320. Alternatively, of the photoelectric conversion elements 311 of the powered device 310 (shown in FIG. 1 and FIG. 2), the one at the center may be provided with a path that allows the signal light 125/325 to pass through so that the signal light 125 or 325 is transmitted to the receiver 330 or from the transmitter 320 through the path.

In the power over fiber system 1C of the fourth embodiment, the feed light 112 output from the first data communication device 100 propagates through the cladding 220 of the optical fiber 250 and is transmitted to the second data communication device 300. In the second data communication device 300, the feed light 112 output from the cladding 220 of the optical fiber 250 is directly transmitted to the powered device 310.

As described above, the powered device 310 of the first embodiment or the second embodiment receives feed light and generates electric power, and has the light-receiving surfaces S311 that are arranged in a concave shape. This can make the intensity of the feed light 112 per unit area uniform, the feed light 112 being transmitted to the photoelectric conversion elements 311, and improve the use efficiency of the photoelectric conversion elements 311.

Further, the powered device 310 of the first embodiment or the second embodiment has the photoelectric conversion elements 311 that include an element(s) having a light-receiving surface S311 of a polygonal shape, wherein sides of the polygonal shape are adjacent to sides of light-receiving surfaces S311 of other photoelectric conversion elements 311. This can easily reduce a gap(s) between the light-receiving surfaces S311 arranged in a concave shape, and hence can reduce a percentage of the feed light 112 that is not input to the photoelectric conversion elements 311, and achieve high-efficient power receiving.

Further, the powered device 310 of the second embodiment includes the diffusing lens 312 that spreads the feed light 112, wherein the photoelectric conversion elements 311 are arranged such that the perpendicular lines thereof pass through the diffusing lens 312. Hence, even when high-intensity feed light 112 is transmitted, the diffusing lens 312 spreads the feed light 112, thereby reducing the intensity of the feed light 112 per unit area, and the photoelectric conversion elements 311 can receive the intensity-reduced feed light 112. This can increase the maximum energy that can be transmitted by the feed light 112. Further, even when the feed light 112 is spread by the diffusing lens 312, the light-receiving surfaces S311 arranged such that the perpendicular lines thereof pass through the diffusing lens 312 can make the intensity of the feed light 112 per unit area uniform, the feed light 112 being transmitted to the photoelectric conversion elements 311, and improve the use efficiency of the photoelectric conversion elements 311.

Further, the above-described power over fiber systems 1A, 1B, 1 and 1C of the first, second, third and fourth embodiments thereof each have the powered device 310 exhibiting the above-described effects, so that a high use efficiency of the photoelectric conversion elements 311 is obtained. This enables high-power/large-output optical power supply while curbing a sharp rise in costs.

Although some embodiments of the present disclosure have been described, the present invention is not limited thereto. For example, the power over fiber system may be configured to have a plurality of optical fiber cables. Further, although in the embodiments, the powered device is applied to the power over fiber system, the powered device of the present disclosure may be applied to optical power supply in general where no optical fiber is used. The details described in the embodiments may be changed as appropriate within a range not departing from the scope of the invention.

INDUSTRIAL APPLICABILITY

The present disclosure is applicable to a powered device and an optical transmission system.

The invention claimed is:

1. An optical transmission system, comprising:
an optical fiber configured to transmit feed light;
a demultiplexer configured to demultiplex the feed light transmitted from the optical fiber;
a plurality of optical fibers configured to receive demultiplexed feed light from the demultiplexer;
a diffusing lens configured to spread the feed light; and
a powered device including a plurality of photoelectric conversion elements,
wherein
the plurality of photoelectric conversion elements is disposed such that light-receiving surfaces of the plurality of photoelectric conversion elements are arranged in a concave shape, and
the diffusing lens is configured to spread the demultiplexed feed light transmitted from each of output ends of the plurality of optical fibers to a corresponding light-receiving surface of the light-receiving surfaces of the plurality of photoelectric conversion elements.

2. The optical transmission system according to claim 1, wherein perpendicular lines of the light-receiving surfaces of the plurality of photoelectric conversion elements intersect the diffusing lens.

3. The optical transmission system according to claim 1, wherein at least one of the light-receiving surfaces of the plurality of photoelectric conversion elements has a polygonal shape, and
wherein sides of the polygonal shape are adjacent to sides of light-receiving surfaces of other photoelectric conversion elements among the plurality of photoelectric conversion elements.

4. The optical transmission system according to claim 1, wherein
the optical fiber includes
a core through which signal light propagates,
a first cladding that is disposed around the core and through which the feed light propagates, and
a second cladding that is disposed around the first cladding.

5. The optical transmission system according to claim 4, wherein
the demultiplexer is configured to demultiplex the feed light transmitted from the first cladding of the optical fiber to the plurality of optical fibers.

* * * * *